United States Patent
Osanai et al.

(10) Patent No.: US 6,938,333 B2
(45) Date of Patent: Sep. 6, 2005

(54) METHOD OF MANUFACTURING A METAL-CERAMIC CIRCUIT BOARD

(75) Inventors: Hideyo Osanai, Tokyo (JP); Masahiro Furo, Tokyo (JP)

(73) Assignee: Dowa Mining Co., Ltd., Tokyo (JP)

( * ) Notice: Subject to any disclaimer, the term of this patent is extended or adjusted under 35 U.S.C. 154(b) by 0 days.

(21) Appl. No.: 10/242,022

(22) Filed: Sep. 12, 2002

(65) Prior Publication Data

US 2003/0037434 A1 Feb. 27, 2003

Related U.S. Application Data

(62) Division of application No. 09/848,140, filed on May 3, 2001.

(30) Foreign Application Priority Data

Sep. 4, 2000 (JP) ........................................ 2000-267206

(51) Int. Cl.[7] .............................................. H05K 3/36
(52) U.S. Cl. .............................. 29/830; 29/831; 29/832; 29/840; 29/842; 29/843
(58) Field of Search ........................ 29/830, 832, 831, 29/840, 842, 843; 219/7.5, 121.65, 121.83, 121.84; 257/701, 723, 725

(56) References Cited

U.S. PATENT DOCUMENTS

| | | | |
|---|---|---|---|
| 3,852,877 A | * | 12/1974 | Ahn et al. ................ 29/851 |
| 3,994,430 A | | 11/1976 | Cusano et al. ............ 228/122 |
| 4,284,437 A | | 8/1981 | Baba et al. |
| 4,531,044 A | | 7/1985 | Chang |
| 4,592,781 A | * | 6/1986 | Cheney et al. ............ 75/249 |
| 4,762,553 A | * | 8/1988 | Savage et al. ............ 75/336 |
| 4,901,137 A | | 2/1990 | Sato et al. |
| 4,906,812 A | * | 3/1990 | Nied et al. ............... 219/121.63 |
| 4,962,291 A | * | 10/1990 | Fujita et al. ............. 219/602 |
| 4,987,677 A | | 1/1991 | Tanaka et al. |
| 5,672,848 A | | 9/1997 | Komorita et al. |

(Continued)

FOREIGN PATENT DOCUMENTS

| | | |
|---|---|---|
| EP | 0676800 A2 | 10/1995 |
| EP | 0788153 A2 | 8/1997 |
| EP | 0827198 A2 | 3/1998 |
| EP | 11226717 | 8/1999 |
| JP | 118588/89 | 7/1992 |
| JP | 147411/88 | 2/1997 |

OTHER PUBLICATIONS

Special Metals Corporation, Nimonic® alloy 91, pp. 1–8, Apr. 2004.

Primary Examiner—Carl J. Arbes
Assistant Examiner—Tai Nguyen
(74) Attorney, Agent, or Firm—Patterson, Thuente, Skaar & Christensen, P.A.

(57) ABSTRACT

A metal-ceramic circuit board is characterized by being constituted by bonding on a base plate of aluminum or aluminum alloy at least one of ceramic substrate boards having a conductive metal member for an electronic circuit. A method of manufacturing a metal-ceramic circuit board is characterized by comprising the steps of melting aluminum or aluminum alloy in a vacuum or inert gas atmosphere to form a molten metal, contacting one surface of a ceramic substrate board directly with the molten metal in a vacuum or inert gas atmosphere, cooling the molten metal and the ceramic substrate board to form a base plate of aluminum or aluminum alloy, which is bonded directly on the ceramic substrate board without forming any oxidizing film therebetween and bonding a conductive metal member for an electronic circuit on the ceramic substrate board by using a brazing material. The base plate has a proof stress not higher than 320 (MPa) and a thickness not smaller than 1 mm.

11 Claims, 3 Drawing Sheets

U.S. PATENT DOCUMENTS

| | | |
|---|---|---|
| 5,707,715 A | 1/1998 | deRochemont et al. |
| 5,767,576 A * | 6/1998 | Kobayashi et al. ......... 257/701 |
| 6,033,787 A | 3/2000 | Nagase et al. |
| 6,040,039 A | 3/2000 | Ikeda et al. |
| 6,110,297 A | 8/2000 | Hayashi et al. |
| 6,123,895 A | 9/2000 | Yamagata et al. |
| 6,175,084 B1 | 1/2001 | Saitoh et al. |
| 6,197,435 B1 | 3/2001 | Tsujimura et al. |

* cited by examiner

METHOD OF MANUFACTURING A METAL-CERAMIC CIRCUIT BOARD

CROSS-REFERENCES TO RELATED APPLICATIONS, IF ANY

This application is a divisional application of co-pending U.S. Ser. No. 09/848,140 which was filed on May 3, 2001 and is entitled "METAL-CERAMIC CIRCUIT BOARD AND MANUFACTURING METHOD THEREOF".

BACKGROUND OF THE INVENTION

1. Field of the Invention

The present invention relates to a method of manufacturing a metal-ceramic circuit board, and, more particularly, relates to a metal-ceramic circuit substrate board having a high heat-cycle resistance, which is suitable for the installation of high power electronic parts, such as power modules, and a manufacturing method thereof.

2. Description of the Prior Art

Recently, high power modules have been used to control a large electric current of electric automobiles, electric cars, tooling machines or the like. The power modules have mainly a plurality of semiconductor tips. A high electric insulation performance is required for a substrate board to which the semiconductor tips are fixed, in order to obtain a large current from a front surface and a back surface of each semiconductor tip. Further, a temperature of the semiconductor tip is elevated by heat generated when a large current is passed through the semiconductor tip. Accordingly, a good heat conductivity has been required for the substrate board on which the semiconductor tips are fixed, and parts surrounding the board.

FIG. 5 shows a conventional power module in section. The power module has semiconductor tips 1, brazing material layers 4, a metal layer 3, a ceramic substrate board 2 as an insulating substrate board, a metal layer 5, a brazing material layer 6, and a metal base plate 7 piled in this order. Reference numeral 8 denotes plating layers formed on the metal layers 3 and 5, and the metal base plate 7. Wirings between the semiconductor tips 1 are omitted in FIG. 5.

Heretofore, various methods have been proposed to bond an aluminum plate and a ceramic substrate board as shown in Japanese Unexamined Utility Model Publication No. 57945/1991 and Japanese Unexamined Utility Model Publication No. 68448/1990. Among these methods, an aluminum plate is bonded to an aluminum nitride board or an alumina board by using a brazing material of Al—Si series or Al—Ge series. U.S. Pat. No. 3,994,430, published on 1976, shows the use of silicone as an aluminum binding assistant.

However, such conventional power modules have following problems because the ceramic substrate board 2 is fixed to the metal base plate 7 through the metal layer 5 and the brazing material layer 6.

(1) The construction of the power module is complicated because between the ceramic substrate board 2 and the metal base plate 7, the metal layer 5, the plating layer 8, the brazing material layer 6 and the plating layer 8 are arranged in this order. Accordingly, each of the components is heated and cooled repeatedly due to the repetition of the start and stop of the electrical conduction, so that cracks are generated on the contacting surfaces of the components depending on the difference in thermal expansion coefficient between the components.

(2) The heat conductivity and the heat radiation ability are reduced because the brazing material layer 6 exists between the ceramic substrate board 2 and the metal base plate 7.

(3) The lead brazing material has been used in spite of the fact that the maker of the electric parts wants to reduce the quantity of use of the lead brazing material.

(4) The surface treatment such as plating or brazing is required in order to improve the adhesivity of the brazing material layer 6 to the ceramic substrate board 2 and the metal base plate 7, so that the cost becomes high.

(5) A copper base plate has been used as a metal base plate. However, the thermal expansion coefficient of the copper is larger than that of the ceramics. Accordingly, cracks are formed easily in the ceramics at a portion where the ceramics is contacted with the copper base plate and the reliability of the power modules becomes low when the heat and cool are repeated. Further, the base plate such as a copper molybdenum alloy or aluminum silicon carbide complex is low in thermal conductivity and high in cost.

SUMMARY OF THE INVENTION

An object of the present invention is to provide a method of making a ceramic-metal composite member of a various form having an excellent property, which is formed by bounding directly a ceramic substrate board with an aluminum base plate.

Further object of the present invention is to obtain a method of manufacturing a ceramic-metal composite member with low cost in mass production basis.

The present inventors have made various studies and found that the above task can be solved by using aluminum or aluminum alloy as a material of a base plate, and bonding a ceramics with the base plate of aluminum or aluminum alloy of which thickness is larger than a predetermined value and of which proof stress is lower than a predetermined value, in such a manner that the aluminum or aluminum alloy is molten in a mold and cooling it by contacting with the ceramics.

Specifically, the ceramics is broken or the base plate is warped on a large scale if a hard metal is used as a base plate, or the base plate is bonded to the ceramics by brazing, without using a soldering method of low temperature. The present inventors have made various studies and further found that the above defect can be obviated by bonding the ceramics directly to an aluminum or aluminum alloy plate having very small proof stress without using any brazing material. The mechanism of the above action is not clear, however, the inventors assume that the residual stress formed by the difference in thermal expansion coefficient between the aluminum or aluminum alloy plate of low proof stress and the ceramics when they are bonded is absorbed by the deformations etc. of the aluminum or aluminum alloy.

A metal-ceramic circuit board of the present invention is characterized by comprising a base plate of aluminum or aluminum alloy and a ceramic substrate board, wherein one surface of the ceramic substrate board is bonded directly to the base plate, and the base plate has a proof stress not higher than 320 (MPa) and a thickness not smaller than 1 mm.

A power module of the present invention is characterized by comprising a base plate of aluminum or aluminum alloy, a ceramic substrate board, and a semiconductor tip wherein one surface of the ceramic substrate board is bonded directly to the base plate, said semiconductor tip is provided on the other surface of said ceramic substrate board and the base plate has a proof stress not higher than 320 (MPa) and a thickness not smaller than 1 mm.

A method of manufacturing a metal-ceramic circuit board of the present invention is characterized by comprising the steps of melting aluminum or aluminum alloy in a vacuum or inert gas atmosphere to from a molten metal, contacting one surface of a ceramic substrate board directly with said molten metal in a vacuum or inert gas atmosphere, and cooling said molten metal and said ceramic substrate board to form a base plate of aluminum or aluminum alloy, which is bonded directly on said one surface of the ceramic substrate board.

A method of manufacturing a metal-ceramic circuit board of the present invention is characterized by comprising the steps of melting aluminum or aluminum alloy in a vacuum or inert gas atmosphere to from a molten metal, contacting one surface of a ceramic substrate board directly with said molten metal in a vacuum or inert gas atmosphere, cooling said molten metal and said ceramic substrate board to form a base plate of aluminum or aluminum alloy, which is bonded directly on said one surface of the ceramic substrate board, and bonding a conductive metal member for an electronic circuit on the other surface of said ceramic substrate board by using a brazing material.

A method of manufacturing a metal-ceramic circuit board of the present invention is characterized by comprising the steps of melting aluminum or aluminum alloy in a vacuum or inert gas atmosphere to form a molten metal, contacting directly one surface of a ceramic substrate board, on the other surface of which a conductive metal member for an electronic circuit being bonded by using or without using a brazing material, with said molten metal in a vacuum or inert gas atmosphere, and cooling said molten metal and said ceramic substrate board to form a base plate of aluminum or aluminum alloy, which is bonded directly on said one surface of the ceramic substrate board.

A method of manufacturing a power module of the present invention is characterized by comprising the steps of melting aluminum or aluminum alloy in a vacuum or inert gas atmosphere to form a molten metal, contacting one surface of a ceramic substrate board directly with said molten metal in a vacuum or inert gas atmosphere, cooling said molten metal and said ceramic substrate board to form a base plate of aluminum or aluminum alloy, which is bonded directly on said one surface of the ceramic substrate board, forming a metal layer of desired pattern on the other surface of said ceramic substrate board, and fixing a semiconductor tip on said metal layer.

The conductive metal member is characterized by containing at least one metal selected from copper, copper alloy, aluminum, and aluminum alloy. As the base plate, aluminum or aluminum alloy can be used. However, aluminum is best, because it has a high heat conductivity, a high heat-cycle resistance, and is low in melting point and easy to manufacture.

As the conductive metal member, copper or copper alloy, aluminum or aluminum alloy is suitable, in case that a special high conductivity is necessary, or it is sufficient to withstand the thermal cycle test of 1000 times.

It is preferable to use aluminum or aluminum alloy in case that it is necessary to withstand the thermal cycle test of more than 3000 times.

The Au plating or Ni plating can be formed on said metal member in order to improve the adhesivity of the brazing material layer to the metal member, and the corrosion resistance.

Said ceramic substrate board is made of a material selected from alumina, aluminum nitride and silicon nitride.

As said ceramic substrate board, alumina is preferable, because it has a high insulating property, a high flexibility of use such that the circuit can be manufactured by the direct bonding of copper, and is cheap. The aluminum nitride has a high thermal conductivity and a high heat radiation ability, so that the tip for controlling a large electric current can be installed. The silicon nitride has a high proof stress and a high heat-cycle resistance, so that it can be used in the strict circumstances, such as in the engine room.

Said base plate is use for enhancing the mechanical proof stress and the heat radiation ability of the module. The wording of the direct bonding means that the base plate is bonded on the ceramic substrate board so as to have a necessary proof stress without using any binding assistant such a brazing material or the like.

These and other aspects and objects of the present invention will be better appreciated and understood when considered in conjunction with the following description and the accompanying drawings. It should be understood, however, that the following description, while indicating preferred embodiments of the present invention, is given by way of illustration and not of limitation. Many changes and modifications may be made within the scope of the present invention without departing from the spirit thereof, and the invention includes all such modifications.

DESCRIPTION OF THE PREFERRED EMBODIMENTS

Figure 5:
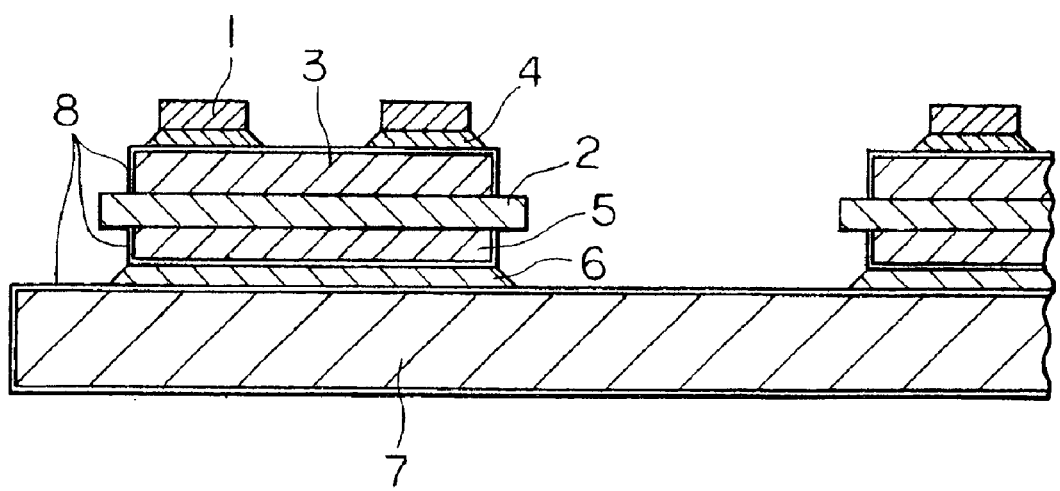
FIG. 5 is a vertically sectioned front view of a conventional power module.

In the following descriptions, parts of the power module of the present invention which are similar to corresponding parts of the power module shown in FIG. 5 have been given corresponding reference numerals and need not be further re-described.

EXAMPLE 1

In a first Example of the present invention, aluminum of 99.99% in purity was set in a crucible formed at an upper portion of a furnace 9, and a plurality of ceramic substrate boards 2 of aluminum nitride were set on an inside bottom portion of the furnace 9 below the crucible. The crucible was closed by a piston 10 and the furnace 9 was filled with nitrogen gas. Then, the furnace 9 was heated at 750° C. by a heater 11 to melt the aluminum in the crucible. The molten aluminum 13 was pushed out by the piston 10 through a narrow conduit 12 connecting between a center bottom portion of the crucible and the inside bottom portion of the furnace 9, so that the molten aluminum 13 was poured on the ceramic substrate boards 2 until the height of the molten aluminum 13 on the ceramic substrate boards 2 reached a predetermined value. Then, the molten aluminum 13 on the ceramic substrate boards 2 was cooled and solidified gradually, to form an aluminum base plate 7 bonded directly on the ceramic substrate boards 2. Thus obtained aluminum base plate 7 had a thickness of 5 mm and a proof stress of 40 MPa. The value of the proof stress was measured along JIS Z2241 a test piece of JIS Z2201.

Then, the base plate 7 with the ceramic substrate boards 2 was taken out from the furnace 9 in order to form a circuit portion on the ceramic substrate board 2. A desired pattern of a brazing material consisting of Al in an amount of 87.5% by weight and Si in an amount of 12.5% by weight (not shown) was printed by using a screen printer, and dried at 80° C. An aluminum rolled plate of a desired pattern was placed as a metal layer 3 on the dried brazing material, and heated at 575° C. in a vacuum furnace. Then, an electro-less nickel plating layer 8 was formed on the metal layer 3 and a semiconductor tip 1 was fixed on the metal layer 3 through the plating layer 8 and a brazing material layer 4 to form a power module as shown in FIG. 2.

A thermal cycle test was performed to evaluate the power module. After the thermal cycle of 4000 times, no change was recognized on the boundary surface between the ceramic substrate layer 2 and the base plate 7.

EXAMPLE 2

Figure 1:
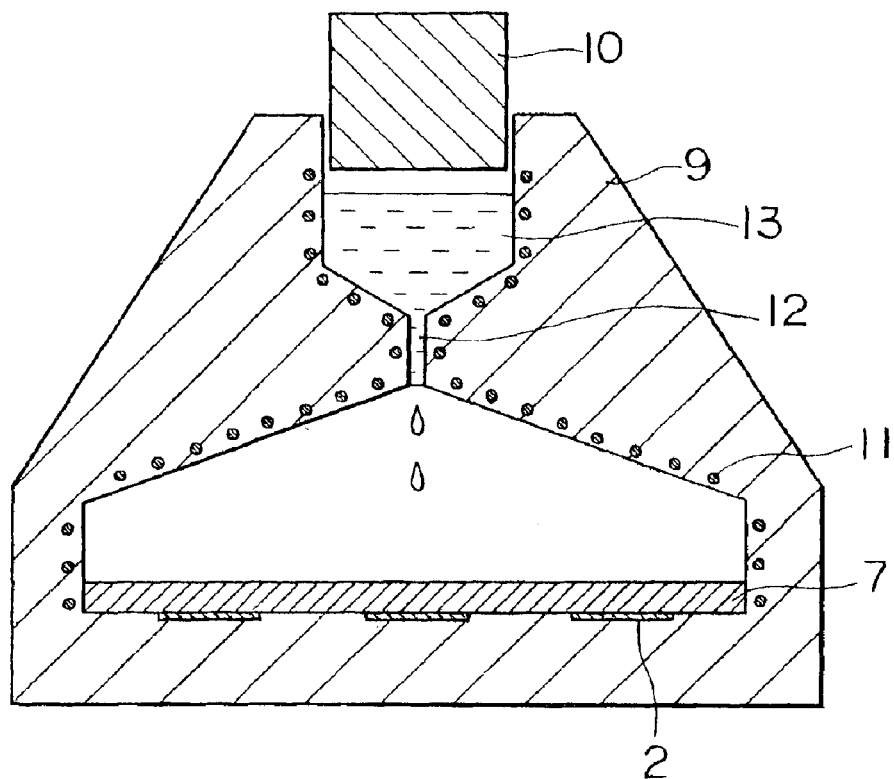
FIG. 1 is a vertically sectioned front view of a furnace for explaining a principle of the present invention.
Figure 2:
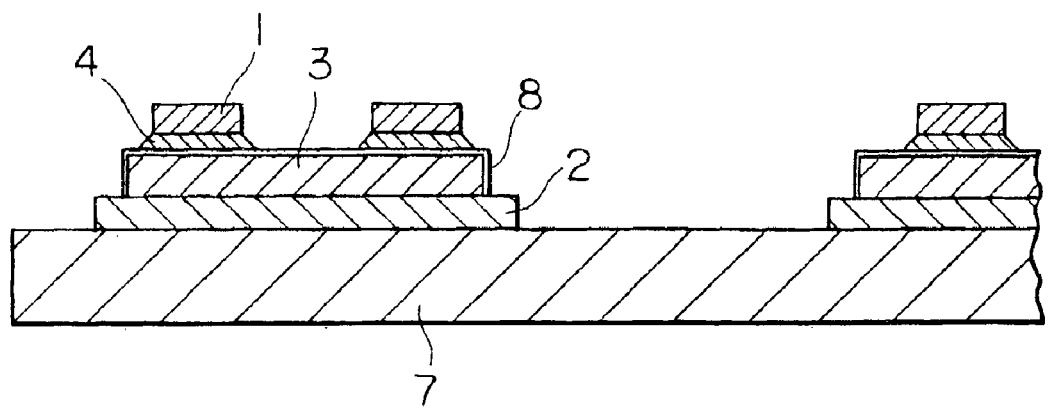
FIG. 2 is a vertically sectioned front view of a power module on an embodiment in accordance with the present invention.

A power module having a metal-ceramic circuit substrate board as shown in FIG. 2 was formed under the same conditions as in the Example 1 except that the thickness of the aluminum base plate 7 was change from 5 mm to 1 mm. A thermal cycle test was performed to evaluate the power module. After the thermal cycle of 4000 times, no change was recognized on the boundary surface between the ceramic substrate layer 2 and the base plate 7 similar to the Example 1.

EXAMPLE 3

A power module having a metal-ceramic circuit substrate board as shown in FIG. 2 was formed under the same conditions as in the Example 1 except that the thickness of the aluminum base plate was change from 5 mm to 10 mm. A thermal cycle test was performed to evaluate the power module. After the thermal cycle of 3000 times, no change was recognized on the boundary surface between the ceramic substrate layer 2 and the base plate 7.

EXAMPLE 4

A power module having a metal-ceramic circuit substrate board as shown in FIG. 2 was formed under the same conditions as in the Example 1 except that the thickness of the aluminum base plate was change from 5 mm to 30 mm. A thermal cycle test was performed to evaluate the power module. After the thermal cycle of 3000 times, no change was recognized on the boundary surface between the ceramic substrate layer 2 and the base plate 7 similar to the Example 3.

EXAMPLE 5

A power module having a metal-ceramic circuit substrate board as shown in FIG. 2 was formed under the same conditions as in the Example 1 except that the material of the base plate 7 was changed from aluminum of 99.99% in purity to aluminum alloy consisting of Al in an amount of 95.5% by weight and Cu in an amount of 4.5% by weight.

The base plate 7 had a thickness of 5 mm and a proof stress of 95 MPa.

A thermal cycle test was performed to evaluate the power module. After the thermal cycle of 3000 times, no change was recognized on the boundary surface between the ceramic substrate layer 2 and the base plate 7 similar to the Example 3.

EXAMPLE 6

A power module having a metal-ceramic circuit substrate board as shown in FIG. 2 was formed under the same conditions as in the Example 1 except that the material of the base plate 7 is changed from aluminum of 99.99% in purity to aluminum alloy consisting of Al in an amount of 87.5% by weight and Si in an amount of 12.5% by weight.

The base plate 7 had a thickness of 5 mm and a proof stress of 320 MPa.

A thermal cycle test was performed to evaluate the power module. After the thermal cycle of 3000 times, no change was recognized on the boundary surface between the ceramic substrate layer 2 and the base plate 7 similar to the Example 3.

EXAMPLE 7

A power module having a metal-ceramic circuit substrate board as shown in FIG. 2 was formed under the same conditions as in the Example 1 except that the material of the ceramic substrate board 2 is changed from aluminum nitride to silicone nitride.

A thermal cycle test was performed to evaluate the power module. After the thermal cycle of 4000 times, no change was recognized on the boundary surface between the ceramic substrate layer 2 and the base plate 7 similar to the Example 1.

EXAMPLE 8

A power module having a metal-ceramic circuit substrate board as shown in FIG. 2 was formed under the same conditions as in the Example 1 except that fins were provided on the base plate 7 in order to improve the heat radiation.

A thermal cycle test was performed to evaluate the power module. After the thermal cycle of 4000 times, no change was recognized on the boundary surface between the ceramic substrate layer 2 and the base plate 7 similar to the Example 1.

EXAMPLE 9

Figure 3:
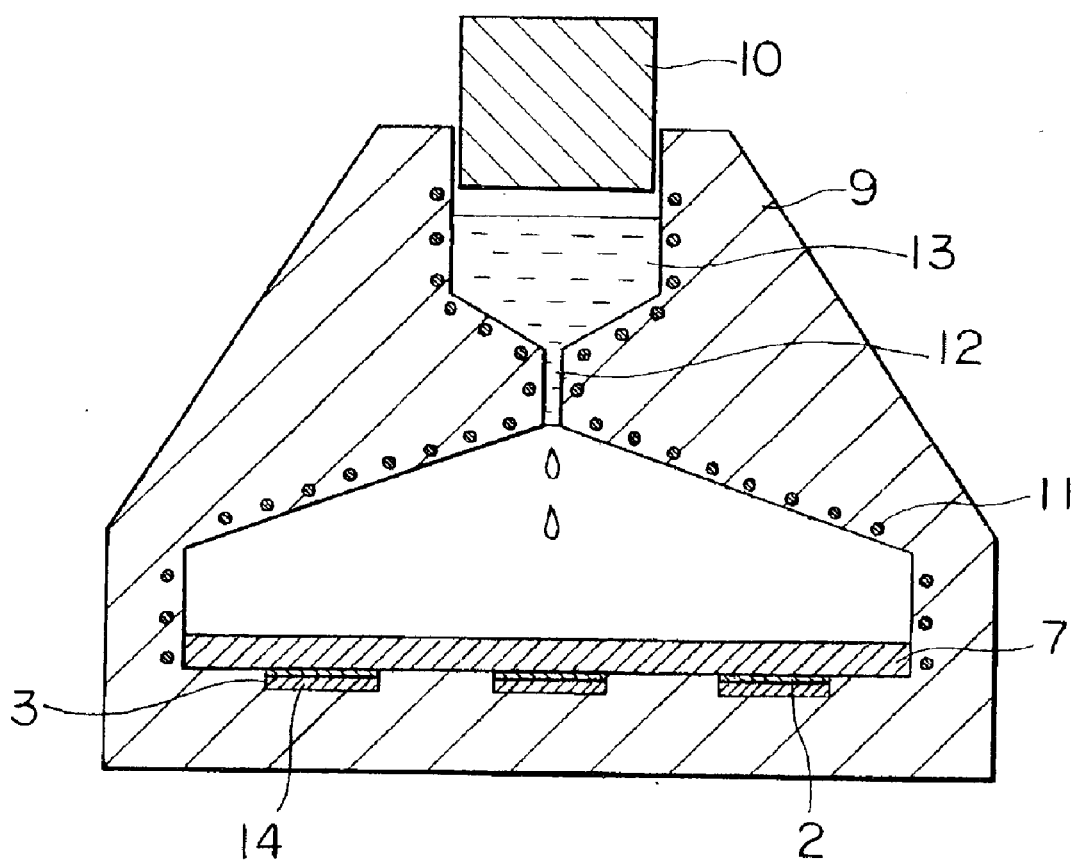
FIG. 3 is a vertically sectioned front view of a furnace for explaining another embodiment of the present invention.

In order to form a circuit portion on an upper surface of the ceramic substrate board 2 of aluminum nitride, an actuated metal brazing material consisting of Ag in an amount of 90% by weight, Ti in an amount of 5% by weight and Cu in an amount of 5% by weight was printed by using a screen printer, and dried at 80° C. A copper rolled plate was placed as a metal layer 3 on the dried brazing material, and heated at 800° C. in a vacuum furnace, so that the metal layer 3 was bonded on the ceramic substrate board 2. Then, an etching resist was printed on the copper portion by using the screen printer, UV dried and subjected to etching using a ferric chloride solution to form a desired pattern 14. The ceramic substrate boards 2 with the metal layers 3 were placed on an inside bottom portion of a furnace 9 with a bottom surface of the ceramic substrate board 2 facing upward as shown in FIG. 3. Aluminum of 99.99% in purity was set in a crucible formed at an upper portion of the furnace 9, and the crucible was closed by a piston 10 and the furnace 9 was filled with nitrogen gas. Then, the furnace 9 was heated at 750° C. by a heater 11 to melt the aluminum in the crucible. The molten aluminum 13 was pushed out by the piston 10 through a narrow conduit 12 connecting between a center bottom portion of the crucible and the inside bottom portion of the furnace 9, so that the molten aluminum 13 was poured on the ceramic substrate boards 2 until the height of the molten aluminum 13 on the ceramic substrate boards 2 reached a predetermined value. Then, the molten aluminum 13 on the ceramic substrate boards 2 was cooled and solidified gradually to form an aluminum base plate 7 bonded directly on the bottom surface of the ceramic substrate boards 2. Thus obtained aluminum base plate 7 had a thickness of 5 mm and a proof stress of 40 MPa.

Then, the base plate 7 with the ceramic substrate boards 2 and the metal layers 3 was taken out from the furnace 9 and a semiconductor tip 1 was fixed on the metal layer 3 through a brazing material layer 4 to form a power module as shown in FIG. 2.

A thermal cycle test was performed to evaluate the power module. After the thermal cycle of 4000 times, no change was recognized on the boundary surface between the ceramic substrate layer 2 and the base plate 7.

EXAMPLE 10

Figure 4:
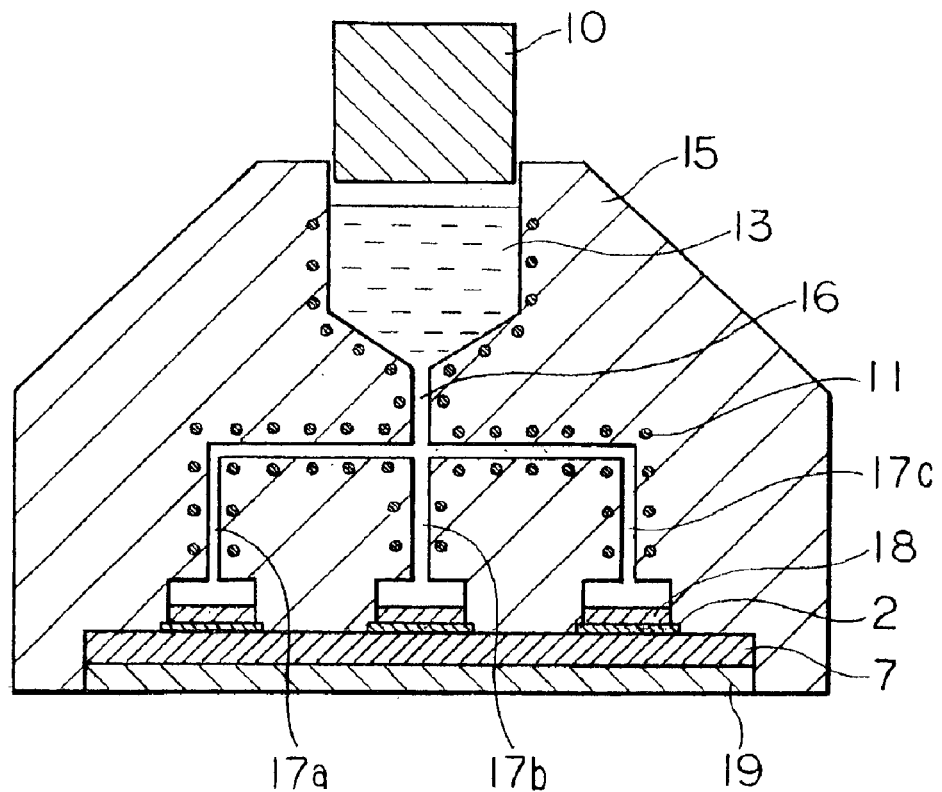
FIG. 4 is a vertically sectioned front view of a furnace for explaining the other embodiment of the present invention.

A plurality of ceramic substrate boards 2 of aluminum nitride were bonded on a base plate 7 of aluminum under the same conditions as in the Example 1. As shown in FIG. 4, a furnace 15 is used and aluminum of 99.99% in purity was set in a crucible formed at an upper portion of the furnace 15. A plurality of ceramic substrate boards 2 of aluminum nitride bonded on the base plate 7 were set on an inside bottom portion of the furnace 15 below the crucible with the ceramic substrate board 2 facing upward. A mold 18 having a mortise of a desired circuit pattern was placed on each ceramic substrate board 2. The crucible was closed by a piston 10 and the furnace 15 was filled with nitrogen gas. Then, the furnace 15 was heated at 750° C. by a heater 11 to melt the aluminum in the crucible. The molten aluminum 13 was pushed out by the piston 10 through a narrow conduit 16 and narrow conduits 17a, 17b and 17c connecting between a center bottom portion of the crucible and the molds 18. A heat sink 19 was arranged at under side of the base plate 7 in order to cool and protect the base plate 7. The pushed out molten aluminum 13 was poured on the ceramic substrate board 2 in the mold 18 until the height of the molten aluminum 13 on the ceramic substrate board 2 reached a predetermined value. Then, the molten aluminum 13 on the ceramic substrate board 2 was cooled and solidified gradually to form a metal layer 3 on the ceramic substrate board 2. Thus obtained aluminum base plate 7 had a thickness of 5 mm and a proof stress of 40 MPa.

The base plate 7 with the ceramic substrate boards 2 and the metal layers 3 was taken out from the furnace 15. A semiconductor tip 1 was fixed on the metal layer 3 through a brazing material layer 4 to form a power module as shown in FIG. 2.

A thermal cycle test was performed to evaluate the power module. After the thermal cycle of 4000 times, no change was recognized on the boundary surface between the ceramic substrate layer 2 and the base plate 7 similar to the Example 1.

COMPARATIVE EXAMPLE 1

A following sample was prepared for comparison. In order to form a circuit portion on an upper surface of a ceramic substrate board of aluminum nitride, a brazing material consisting of Al in an amount of 87.5% by weight and Si in an amount of 12.5% by weight was printed on the upper surface of the ceramic substrate board 2 by using a screen printer to form a desired pattern, and dried at 80° C. An aluminum rolled plate of a desired pattern was placed on the brazing material. The same brazing material was printed entirely on a lower surface of the ceramic substrate board, an aluminum rolled plate of a desired pattern was placed thereon, and heated at 575° C. in a vacuum furnace. Then, the ceramic substrate board was subjected to an electro-less nickel plating. Three sheets of the ceramic substrate board thus obtained were fixed by brazing on an aluminum base plate having a thickness of 5 mm and a purity of 99.99% which was subjected to an electro-less nickel plating. A semiconductor tip was fixed on the aluminum layer formed on the ceramic substrate board to form a power module as shown in FIG. 5.

A thermal cycle test was performed to evaluate the power module, as like as the Examples. After the thermal cycle of 1000 times, cracks were recognized in the brazing material layer on the boundary surface between the ceramic substrate board and the base plate.

COMPARATIVE EXAMPLE 2

A following sample was prepared for comparison. A power module as shown in FIG. 5 was formed under the similar manner as in the comparative Example 1 except that the material of the base plate was changed from aluminum to a copper molybdenum alloy of 5 mm in thickness. A thermal cycle test was performed to evaluate the power module, as like as the Examples. After the thermal cycle of 3000 times, cracks were recognized in the brazing material layer on the boundary surface between the ceramic substrate layer 2 and the base plate 7.

COMPARATIVE EXAMPLE 3

A following sample was prepared for comparison. A molten aluminum as shown in the Example 1 was contacted directly to both surfaces of a ceramic substrate board of aluminum nitride, cooled and solidified to form aluminum layers. Then, in order to form a circuit portion on one of the both surfaces of the ceramic substrate board, an etching resist was printed on the one surface by using a screen printer, UV dried and subjected to etching using a ferric chloride solution to form a desired circuit pattern. The ceramic substrate board with the circuit pattern was subjected to an electro-less nickel plating. Three sheets of the ceramic substrate board thus obtained were fixed by brazing on an aluminum base plate subjected to an electro-less nickel plating and having a thickness of 5 mm and a purity of 99.99%. Further, a semiconductor tip was provided on each of the substrate boards to form a power module as shown in FIG. 5.

A thermal cycle test was performed to evaluate the power module, as like as the Examples. After the thermal cycle of 3000 times, cracks were recognized in the brazing material layer on the boundary surface between the ceramic substrate board and the base plate.

COMPARATIVE EXAMPLE 4

A following sample was prepared for comparison. In order to bond three sheets of ceramic substrate board of aluminum nitride on one surface of a base plate of 99.99% in purity having a thickness of 5 mm, a brazing material consisting of Al in an amount of 87.5% by weight and Si in an amount of 12.5% by weight was printed on the base plate by using a screen printer and dried at 80° C. A ceramic substrate board was placed on the brazing material and heated at 575° C. in a vacuum furnace. It was examined to form a circuit on the other side of the base plate by a brazing method similar to the above, however all of the ceramic substrate boards were cracked when the ceramic substrate boards were bonded on the base plate.

COMPARATIVE EXAMPLE 5

A following sample was prepared for comparison. It was examined to form a power module having a metal-ceramic circuit substrate board as shown in FIG. 2 under the same conditions as in the Example 1 except that the thickness of the aluminum base plate was change from 5 mm to 0.5 mm. However, the base plate deformed easily because of the lack of proof stress.

COMPARATIVE EXAMPLE 6

A following sample was prepared for comparison. It was examined to form a power module having a metal-ceramic circuit substrate board as shown in FIG. 2 under the same conditions as in the Example 1 except that the material of the base plate was changed from aluminum of 99.99% in purity to aluminum alloy consisting of Al in an amount of 88% by weight, Cu in an amount of 2% by weight, Mg in an amount of 3% by weight and Zn in an amount of 7% by weight. The base plate had a thickness of 5 mm and a proof stress of 540 MPa.

However, all of the ceramic substrate boards are cracked when the ceramic substrate boards were bonded on the base plate.

The above results are shown in Table 1 and Table 2.

According to the present invention, following advantages can be obtained.

(1) The reliability of the metal-ceramic circuit board when the cooling and heating are repeated, can be elevated remarkably, because the structure between the ceramic substrate board and the base plate is simple. Specifically, aluminum or aluminum alloy is used as the material of the base plate and bonded directly on the ceramic substrate board, so that any irregularity in thermal expansion and contraction of the base plate when it is heated and cooled is eliminated, and the crack is prevented from being occurred in the contact portion of the ceramic substrate board by the softness of aluminum.

(2) A high heat conductivity can be obtained because the structure between the ceramic substrate board and the base plate is simple, and the brazing material layer of low in heat conductivity can be omitted.

(3) The cost can be reduced because the structure between the ceramic substrate board and the base plate is simple, so that any brazing for bonding the both can be omitted, and that any surface treatment such as plating or the brazing can be omitted.

TABLE 1

| Number | Base plate | | | Insulating | Circuit | Manufacturing method | | |
| | Base metal | Strength (MPa) | Thickness (mm) | material Ceramics | Circuit metal | Bonding method of base side | Order | Bonding method of circuit side |
| --- | --- | --- | --- | --- | --- | --- | --- | --- |
| Example 1 | 99.99% Al | 40 | 5 | AlN | Al | Hot-dip method | → | Brazing method |
| Example 2 | 99.99% Al | 40 | 1 | AlN | Al | Hot-dip method | → | Brazing method |
| Example 3 | 99.99% Al | 40 | 10 | AlN | Al | Hot-dip method | → | Brazing method |
| Example 4 | 99.99% Al | 40 | 30 | AlN | Al | Hot-dip method | → | Brazing method |
| Example 5 | Al + Cu | 95 | 5 | AlN | Al | Hot-dip method | → | Brazing method |
| Example 6 | Al + Si | 320 | 5 | AlN | Al | Hot-dip method | → | Brazing method |
| Example 7 | 99.99% Al | 40 | 5 | $Si_3N_4$ | Al | Hot-dip method | → | Brazing method |
| Example 8 | 99.99% Al | 40 | 5 | AlN | Al | Hot-dip method | → | Brazing method |
| Example 9 | 99.99% Al | 40 | 5 | AlN | Cu | Hot-dip method | ← | Brazing method |
| Example 10 | 99.99% Al | 40 | 5 | AlN | Al | Hot-dip method | → | Hot-dip method |
| Comparative Example 1 | 99.99% Al | 40 | 5 | AlN | Al | Brazing | ← | Brazing method |
| Comparative Example 2 | Cu + Mo | 40 | 5 | AlN | Al | Brazing | ← | Brazing method |
| Comparative Example 3 | 99.99% Al | 40 | 5 | AlN | Al | Brazing | ← | Hot-dip method |
| Comparative Example 4 | 99.99% Al | 40 | 5 | AlN | Al | Brazing method | → | |
| Comparative Example 5 | 99.99% Al | 40 | 0.5 | AlN | Al | Hot-dip method | → | Brazing method |
| Comparative Example 6 | Al + Cu + Mg + Zn | 540 | 5 | AlN | Al | Hot-dip method | → | Brazing method |

TABLE 2

| | | Property | | |
| Number | Others | Heat cycle strength | Crack at bonding | Module strength |
| --- | --- | --- | --- | --- |
| Example 1 | | No problem at 4000 cycle | No | No problem |
| Example 2 | | No problem at 4000 cycle | No | No problem |
| Example 3 | | No problem at 3000 cycle | No | No problem |
| Example 4 | | No problem at 3000 cycle | No | No problem |
| Example 5 | | No problem at 3000 cycle | No | No problem |
| Example 6 | | No problem at 3000 cycle | No | No problem |
| Example 7 | | No problem at 4000 cycle | No | No problem |
| Example 8 | With fin | No problem at 4000 cycle | No | No problem |
| Example 9 | | No problem at 4000 cycle | No | No problem |
| Example 10 | | No problem at 4000 cycle | No | No problem |
| Comparative Example 1 | | Crack at 1000 cycle | No | No problem |
| Comparative Example 2 | | Crack at 3000 cycle | No | No problem |
| Comparative Example 3 | | Crack at 3000 cycle | No | No problem |
| Comparative Example 4 | | | Yes | No problem |
| Comparative Example 5 | | | Yes | Problem |
| Comparative Example 6 | | | Yes | No problem |

(4) Copper used conventionally as a base plate is cheap. However, the thermal expansion coefficient is larger than that of the ceramics, so that the reliability is low because a crack is formed easily on the bonding surface between the ceramic substrate board and the base plate when the heating and cooling are repeated. Copper molybdenum alloy or aluminum silicon carbide composite material is low in heat conductivity and high in cost. On the contrary, aluminum is cheap and very small in proof stress, though the thermal expansion coefficient is high, so that the crack is hardly formed on the boundary surface between the ceramic substrate board and the base plate even if the heating and cooling are repeated and that high reliability can be obtained.

(5) It is considered such a manufacturing method that a circuit substrate board is manufactured by bonding a base plate of aluminum, aluminum alloy, copper, copper molybdenum alloy, or aluminum silicon carbide composite material on a ceramic substrate board by using brazing material. However, the ceramic substrate board is deformed to a large extent and cracks are formed easily in the ceramic substrate board due to the difference in thermal expansion and reduction between the bonded base plate and the ceramic substrate board, because the thickness of the base plate is larger than the thickness of the ceramic substrate board, the bonding layer of brazing material low in flexibility is formed between the base plate and the ceramic substrate board. On the contrary, in the present invention, the above defects can be obviated, because the base plate of aluminum or aluminum alloy of less than 320 (MPa) in proof stress and more than 1 mm in thickness is bonded directly to the ceramic substrate board so as to have a bonding portion very high in flexibility.

(6) The substrate board for the power module according to the present invention is suitable especially to control a large electric current of electric automobiles, electric cars, tooling machines or the like, because the reliability, and the yield are high and the cost is low.

(7) The heat treatment is carried out in the inert gas, so that the oxidization of the material is prevented and the good bonding can be achieved. Further, the temperature in the furnace may be set to 550°~850° C.

While the invention has been particularly shown and described with reference to the preferred embodiments thereof, it will be understood by those skilled in the art that various changes in form and details may be made therein without departing from the spirit and scope of the invention as defined by the appended claims.

What is claimed is:

1. A method of manufacturing a metal-ceramic circuit board comprising the steps of:
   placing a quantity of aluminum alloy in a furnace;
   placing a ceramic substrate board in an inside bottom portion of the furnace;
   creating an inert gas atmosphere inside the furnace;
   melting the aluminum or aluminum alloy to form a molten metal;
   dispensing the molten metal via a narrow conduit onto the ceramic substrate board and in direct contact with a first surface of the ceramic substrate; and
   cooling the molten metal and the ceramic substrate board to form a base plate comprising an aluminum or aluminum alloy, layer bonded directly on the first surface of the ceramic substrate board.

2. The method of manufacturing the metal-ceramic circuit board according to claim 1, wherein ceramic substrate board is made of a material selected from the group consisting of alumina, aluminum nitride and silicon nitride.

3. A method of manufacturing a metal-ceramic circuit board according to claim 1, further comprising the steps of:
   bonding a conductive metal member for an electric circuit on a second surface of the ceramic substrate board using a brazing material.

4. The method of manufacturing the metal-ceramic circuit board according to claim 3, wherein the ceramic substrate board is made of a material selected from alumina, aluminum nitride and silicon nitride.

5. The method of manufacturing the metal-ceramic circuit board according to claim 3, wherein the conductive metal member contains at least one metal selected from the group consisting of copper, copper alloy, aluminum, and aluminum alloy.

6. A method of manufacturing a metal-ceramic circuit board characterized by comprising the steps of melting aluminum or aluminum alloy in a vacuum or inert gas atmosphere to form a molten metal, contacting directly one surface of a ceramic substrate board, on the other surface of which a conductive metal member for an electronic circuit being bonded by using a brazing material, with said molten metal in a vacuum or inert gas atmosphere, and cooling said molten metal and said ceramic substrate board to form a base plate of aluminum or aluminum alloy, which is bonded directly on said one surface of the ceramic substrate board.

7. The method of manufacturing the metal-ceramic circuit board according to claim 6, wherein said ceramic substrate board is made of a material selected from alumina, aluminum nitride and silicon nitride.

8. The method of manufacturing the metal-ceramic circuit board according to claim 6, wherein said conductive metal member contains at least one metal selected from copper, copper alloy, aluminum, and aluminum alloy.

9. A method of manufacturing a metal-ceramic circuit board comprising the steps of:
   melting aluminum or aluminum alloy in a furnace;
   placing a ceramic substrate in an inside bottom portion of the furnace;
   creating an inert gas atmosphere inside the furnace;
   melting the aluminum or aluminum alloy to form a molten metal;
   dispensing the molten metal via a narrow conduit onto the ceramic substrate board and in direct contact with a first surface of the ceramic substrate board, wherein a conductive metal member for an electronic circuit is bonded to a second surface of the ceramic substrate board with the molten metal; and
   cooling the molten metal and the ceramic substrate board to form a base plate of aluminum or aluminum alloy, bonded directly onto the first surface of the ceramic substrate board.

10. The method of manufacturing the metal-ceramic circuit board according to claim 9, wherein the ceramic substrate board is made of a material selected from the group consisting of alumina, aluminum nitride and silicon nitride.

11. The method of manufacturing the metal-ceramic circuit board according to claim 9, wherein the conductive metal member contains at least one metal selected from copper, copper alloy, aluminum, and aluminum alloy.

* * * * *